(12) United States Patent
Dikic et al.

(10) Patent No.: US 9,801,284 B2
(45) Date of Patent: Oct. 24, 2017

(54) METHOD OF MANUFACTURING A PATTERNED CONDUCTOR

(71) Applicant: Dow Global Technologies LLC, Midland, MI (US)

(72) Inventors: Tamara Dikic, Bergen Op Zoom (NL); Michael A. De Graaf, Middelburg (NL); Christophe Brault, Saint-Chef (FR); Stefan Prot, Breskens (NL); C A Torfs-Van Cotthem, Terneuzen (NL)

(73) Assignee: Dow Global Technologies LLC, Midland, MI (US)

( * ) Notice: Subject to any disclaimer, the term of this patent is extended or adjusted under 35 U.S.C. 154(b) by 0 days.

(21) Appl. No.: 14/944,811

(22) Filed: Nov. 18, 2015

(65) Prior Publication Data

US 2017/0142842 A1    May 18, 2017

(51) Int. Cl.
| | |
|---|---|
| *B23B 37/00* | (2006.01) |
| *C03C 25/68* | (2006.01) |
| *C03C 15/00* | (2006.01) |
| *C23F 1/00* | (2006.01) |
| *H01L 21/302* | (2006.01) |
| *H01L 21/461* | (2006.01) |
| *H01L 21/31* | (2006.01) |
| *H01L 21/469* | (2006.01) |
| *H01L 21/00* | (2006.01) |
| *H05K 3/06* | (2006.01) |
| *H01G 9/055* | (2006.01) |
| *C23F 4/00* | (2006.01) |
| *C23F 1/02* | (2006.01) |
| *H05K 1/02* | (2006.01) |
| *H05K 1/09* | (2006.01) |
| *H05K 3/22* | (2006.01) |

(52) U.S. Cl.
CPC ............ *H05K 3/06* (2013.01); *C23F 1/02* (2013.01); *C23F 4/00* (2013.01); *H01G 9/055* (2013.01); *H05K 1/0274* (2013.01); *H05K 1/09* (2013.01); *H05K 3/064* (2013.01); *H05K 3/22* (2013.01); *C03C 2218/33* (2013.01); *H05K 2201/0275* (2013.01)

(58) Field of Classification Search
None
See application file for complete search history.

(56) References Cited

U.S. PATENT DOCUMENTS

| | | | |
|---|---|---|---|
| 7,956,525 B2 | 6/2011 | Armitage et al. | |
| 8,018,568 B2 | 9/2011 | Allemand et al. | |
| 8,049,333 B2 | 11/2011 | Alden et al. | |
| 8,094,247 B2 | 1/2012 | Allemand et al. | |
| 8,284,332 B2 | 10/2012 | Geaghan et al. | |
| 8,957,322 B2 | 2/2015 | Wolk et al. | |
| 9,066,425 B2 | 6/2015 | Joo et al. | |
| 2008/0053956 A1* | 3/2008 | Gomez | C03C 17/06 216/41 |
| 2011/0147054 A1* | 6/2011 | Yamazaki | G02F 1/13439 174/254 |
| 2011/0300347 A1 | 12/2011 | Yoon et al. | |
| 2012/0103669 A1 | 5/2012 | Pruneri et al. | |
| 2013/0017321 A1 | 1/2013 | Kim et al. | |
| 2014/0158400 A1* | 6/2014 | Wolk | H05K 1/0296 174/250 |
| 2014/0290979 A1* | 10/2014 | Joo | H05K 9/0084 174/250 |

FOREIGN PATENT DOCUMENTS

KR    10-1172476    7/2011

OTHER PUBLICATIONS

Czaplewski, et al., Nonlithographic approach to nanostructure fabrication using a scanned electrospinning source, J. Vac. Sci. Technol. B 21(6), pp. 2994-2997, (Nov./Dec. 2003).
Huang, et al., A review on polymer nanofibers by electrospinning and their applications in nanocomposites, Composites Science and Technology, 63, pp. 2223 53 (2003).

* cited by examiner

*Primary Examiner* — Stephanie Duclair
(74) *Attorney, Agent, or Firm* — Thomas S. Deibert

(57) ABSTRACT

A method of manufacturing a patterned conductor is provided, comprising: providing a substrate, comprising: a base material with an electrically conductive layer disposed thereon; providing an electrically conductive layer etchant; providing a spinning material, comprising: a carrier; and, a photosensitive masking material; providing a developer; forming a plurality of masking fibers and depositing them onto the electrically conductive layer to form a plurality of deposited fibers; patterning the plurality of deposited fibers to provide a treated fiber portion and an untreated fiber portion; developing the plurality of deposited fibers, wherein either the treated fiber portion or the untreated fiber portion is removed, leaving a patterned fiber array; contacting the electrically conductive layer to the electrically conductive layer etchant, wherein the electrically conductive layer that is uncovered by the patterned fiber array is removed, leaving a patterned conductive network on the substrate.

9 Claims, No Drawings

METHOD OF MANUFACTURING A PATTERNED CONDUCTOR

The present invention relates generally to the field of manufacture of patterned conductors. In particular, the present invention relates to the field of manufacture of patterned transparent conductors.

Films that exhibit a high conductivity in combination with a high transparency are of great value for use as electrodes or coatings in a wide range of electronic applications, including, for example, touch screen displays and photovoltaic cells. Current technology for these applications involves the use of a tin doped indium oxide (ITO) containing films that are deposited through physical vapor deposition methods. The high capital cost of physical vapor deposition processes has led to the desire to find alternative transparent conductive materials and coating approaches. The use of silver nanowires dispersed as a percolating network has emerged as a promising alternative to ITO containing films. The use of silver nanowires potentially offer the advantage of being processable using roll to roll techniques. Hence, silver nanowires offer the advantage of low cost manufacturing with the potential of providing higher transparency and conductivity than conventional ITO containing films.

In capacitive touch screen applications, conductive patterns are required. One of the key challenges for such applications is that the patterns formed must be invisible (or nearly so) to the human eye.

One approach to providing nanowire based, patterned, transparent conductors has been disclosed by Allemand et al. in U.S. Pat. No. 8,018,568. Allemand et al. disclose an optically uniform transparent conductor comprising: a substrate; a conductive film on the substrate, the conductive film including a plurality of interconnecting nanostructures, wherein a pattern on the conductive film defines (1) an unetched region having a first resistivity, a first transmission and a first haze and (2) an etched region having a second resistivity, a second transmission and a second haze; and, wherein the etched region is less conductive than the unetched region, a ratio of the first resistivity over the second resistivity is at least 1000; the first transmission differs from the second transmission by less than 5%; and the first haze differs from the second haze by less than 0.5%.

Another approach for producing patterned, transparent conductors has been disclosed by Joo et al. in U.S. Pat. No. 9,066,425. Joo et al. disclose a method of manufacturing patterned conductor is provided, comprising: providing a conductivized substrate, wherein the conductivized substrate comprises a substrate and an electrically conductive layer; providing an electrically conductive layer etchant; providing a spinning material; providing a masking fiber solvent; forming a plurality of masking fibers and depositing the plurality of masking fibers onto the electrically conductive layer; exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and, exposing the plurality of masking fibers to the masking fiber solvent, wherein the plurality of masking fibers are removed to uncover the interconnected conductive network on the substrate.

Notwithstanding, there remains a need for alternative methods of manufacturing patterned conductors. Specifically, there remains a need for alternative methods of manufacturing patterned transparent conductors having an electrically conductive region and a non-electrically conductive region, wherein the electrically conductive region and the non-electrically conductive region are essentially indistinguishable to the human eye and wherein the number of required processing steps is minimized.

The present invention provides a method of manufacturing a patterned conductor, comprising: providing a substrate, wherein the substrate comprises: a base material; and, an electrically conductive layer, wherein the electrically conductive layer is disposed on the substrate; providing an electrically conductive layer etchant; providing a spinning material, wherein the spinning material comprises: a carrier; and, a masking material, wherein the masking material is a photosensitive material; providing a developer; forming a plurality of masking fibers by processing the spinning material by a process selected from the group consisting of electrospinning, gas jet electrospinning, needleless electrospinning, and melt electrospinning; depositing the plurality of masking fibers onto the electrically conductive layer, forming a plurality of deposited fibers; optionally, compressing the plurality of deposited fibers on the electrically conductive layer; patterning the plurality of deposited fibers to modify a property of a select portion of the plurality of deposited fibers to provide a treated fiber portion and an untreated fiber portion; developing the plurality of deposited fibers by contacting the plurality of deposited fibers with the developer, wherein either (i) the treated fiber portion, or (ii) the untreated fiber portion is removed; leaving a patterned fiber array; contacting the electrically conductive layer to the electrically conductive layer etchant, wherein the electrically conductive layer that is uncovered by the patterned fiber array is removed from the substrate, leaving a patterned conductive network on the substrate covered by the patterned fiber array to provide the patterned conductor; optionally, providing a stripper; and, optionally, treating the patterned fiber array with the stripper, wherein the patterned fiber array is removed to uncover the patterned conductive network on the substrate.

The present invention provides a method of manufacturing a patterned conductor, comprising: providing a substrate, wherein the substrate comprises: a base material; and, an electrically conductive layer, wherein the electrically conductive layer is disposed on the substrate; providing an electrically conductive layer etchant; providing a spinning material, wherein the spinning material comprises: a carrier; and, a masking material, wherein the masking material is a photosensitive material; providing a developer; forming a plurality of masking fibers by processing the spinning material by a process selected from the group consisting of electrospinning, gas jet electrospinning, needleless electrospinning, and melt electrospinning; depositing the plurality of masking fibers onto the electrically conductive layer, forming a plurality of deposited fibers; optionally, compressing the plurality of deposited fibers on the electrically conductive layer; patterning the plurality of deposited fibers to modify a property of a select portion of the plurality of deposited fibers to provide a treated fiber portion and an untreated fiber portion; developing the plurality of deposited fibers by contacting the plurality of deposited fibers with the developer, wherein either (i) the treated fiber portion, or (ii) the untreated fiber portion is removed; leaving a patterned fiber array; contacting the electrically conductive layer to the electrically conductive layer etchant, wherein the electrically conductive layer that is uncovered by the patterned fiber array is removed from the substrate, leaving a patterned conductive network on the substrate covered by the patterned fiber array to provide the patterned conductor; providing a stripper; and, treating the patterned fiber array with the stripper, wherein the patterned fiber array is removed to uncover the patterned conductive network on the substrate.

The present invention provides a method of manufacturing a patterned conductor, comprising: providing a substrate, wherein the substrate comprises: a base material; and, an electrically conductive layer, wherein the electrically conductive layer is disposed on the substrate; providing an electrically conductive layer etchant; providing a spinning material, wherein the spinning material comprises: a carrier; and, a masking material, wherein the masking material is a photosensitive material; providing a developer; forming a plurality of masking fibers by processing the spinning material by a process selected from the group consisting of electrospinning, gas jet electrospinning, needleless electrospinning, and melt electrospinning; depositing the plurality of masking fibers onto the electrically conductive layer, forming a plurality of deposited fibers; compressing the plurality of deposited fibers on the electrically conductive layer; patterning the plurality of deposited fibers to modify a property of a select portion of the plurality of deposited fibers to provide a treated fiber portion and an untreated fiber portion; developing the plurality of deposited fibers by contacting the plurality of deposited fibers with the developer, wherein either (i) the treated fiber portion, or (ii) the untreated fiber portion is removed; leaving a patterned fiber array; contacting the electrically conductive layer to the electrically conductive layer etchant, wherein the electrically conductive layer that is uncovered by the patterned fiber array is removed from the substrate, leaving a patterned conductive network on the substrate covered by the patterned fiber array to provide the patterned conductor; providing a stripper; and, treating the patterned fiber array with the stripper, wherein the patterned fiber array is removed to uncover the patterned conductive network on the substrate.

The present invention provides a patterned transparent conductor made according to the method of the present invention.

DETAILED DESCRIPTION

The term "Total transmittance" used herein and in the appended claims refers to the light transmission (in %) exhibited by the patterned transparent conductor of the present invention measured according to ASTM D1003-11e1.

The term "Haze" used herein and in the appended claims refers to the haze (in %) exhibited by the patterned transparent conductor of the present invention measured according to ASTM D1003-11e1.

The patterned conductor made using the method of the present invention is useful in a variety of applications such as in electromagnetic shielding applications. The preferred patterned transparent conductor made using the method of the present invention is particularly useful in capacitive touch screen applications. For use in such applications, it is desirable to provide a transparent conductor having a pattern of electrically conducting and non-electrically conducting regions. One significant challenge in providing such patterned transparent conductors is in maximizing the total transmittance and minimizing the haze. Another challenge is to reduce the number of process steps required to obtain the patterned transparent conductor. The method of the present invention enables the preparation of a patterned transparent conductor using significantly fewer process steps than is required by conventional ITO process lithography approaches.

The method of manufacturing a patterned conductor (preferably, a patterned transparent conductor) of the present invention preferably comprises: providing a substrate (preferably, a conductivised transparent substrate; more preferably, a metalized transparent substrate), wherein the substrate comprises: a base material (preferably, wherein the base material is a transparent material); and, an electrically conductive layer (preferably an electrically conductive metal layer), wherein the electrically conductive layer is disposed on the base material; providing an electrically conductive layer etchant; providing a spinning material, wherein the spinning material comprises: a carrier; and, a masking material, wherein the masking material is a photosensitive material (e.g., a positive or negative tone photoresist material); providing a developer; forming a plurality of masking fibers by processing the spinning material by a process selected from the group consisting of electrospinning, gas jet electrospinning, needleless electrospinning and melt electrospinning; depositing the plurality of masking fibers onto the electrically conductive layer, forming a plurality of deposited fibers; optionally, compressing the plurality of deposited fibers on the electrically conductive layer; patterning the plurality of deposited fibers to modify a property of a select portion of the plurality of deposited fibers to provide a treated fiber portion and an untreated fiber portion; developing the plurality of deposited fibers by contacting the plurality of deposited fibers with the developer, wherein either (i) the treated fiber portion, or (ii) the untreated fiber portion is removed; leaving a patterned fiber array; contacting the electrically conductive layer with the electrically conductive layer etchant, wherein the electrically conductive layer that is uncovered by the patterned fiber array is removed from the substrate, leaving a patterned conductive network on the substrate covered by the patterned fiber array to provide the patterned conductor; optionally, providing a stripper; and, optionally, treating the patterned fiber array with the stripper, wherein the patterned fiber array is removed to uncover the patterned conductive network on the substrate.

Preferably, in the method of the present invention, the substrate provided comprises a base material selected from any known base materials. Preferably, the base material is a transparent base material, including: both transparent conductive and transparent nonconductive base materials. Preferably, in the method of the present invention, the substrate provided comprises a base material, wherein the base material is a transparent base material selected from the group consisting of polyethylene terephthalate (PET), polycarbonate (PC), polymethyl methacrylate (PMMA); polyethylene naphthalate (PEN), polyethersulfone (PES), cyclic olefin polymer (COP), triacetylcellulose (TAC), polyvinyl alcohol (PVA), polyimide (PI), polystyrene (PS)(e.g., biaxially stretched polystyrene), polythiols, polyarylether ketones (e.g., polyether ether ketone (PEEK)) and glass (e.g., Gorilla® glass and Willow® glass both available from Dow Corning). More preferably, in the method of the present invention, the substrate provided comprises a base material, wherein the base material is a transparent base material selected from the group consisting of glass, polyethylene, polyethylene terephthalate, polycarbonate and polymethyl methacrylate. Most preferably, in the method of the present invention, the substrate provided comprises a base material, wherein the base material is polyethylene terephthalate.

Preferably, in the method of the present invention, the substrate provided comprises an electrically conductive layer selected from any known conductive materials. Preferably, in the method of the present invention, the substrate provided comprises an electrically conductive layer, wherein the electrically conductive layer comprises a conductive metal or metal oxide. Preferably, in the method of the present invention, the substrate provided comprises an electrically conductive layer, wherein the electrically conductive layer is an electrically conductive metal layer selected from the group consisting of silver, copper, palladium, platinum, gold, zinc, silicon, cadmium, tin, lithium, nickel, indium, chromium, antimony, gallium, boron molybdenum, germanium, zirconium, beryllium, aluminum, magnesium, manganese, cobalt, titanium, alloys and oxides thereof. More preferably, in the method of the present invention, the substrate provided comprises an electrically conductive layer, wherein the electrically conductive metal layer is selected from the group consisting of silver and silver alloyed with at least one element selected from the group consisting of copper, palladium, platinum, gold, zinc, silicon, cadmium, tin, lithium, nickel, indium, chromium, antimony, gallium, boron molybdenum, germanium, zirconium, beryllium, aluminum, magnesium, manganese, cobalt and titanium. Most preferably, in the method of the present invention, the substrate provided comprises an electrically conductive layer, wherein the electrically conductive metal layer is silver.

Preferably, in the method of the present invention, the substrate provided comprises a base material and an electrically conductive layer, wherein the electrically conductive layer is disposed on the substrate. More preferably, in the method of the present invention, the electrically conductive layer is disposed on the base material (preferably, wherein the base material is a transparent material) by coupling together using known techniques. Preferably, the electrically conductive layer is disposed on the base material (preferably, wherein the base material is a transparent material) by taking a conductive foil or sheet and laminating it onto the surface of the base material using an adhesive. Preferably, in the method of the present invention, the electrically conductive layer is disposed on the base material by depositing the electrically conductive layer onto a surface of the base material (preferably, wherein the base material is a transparent material) using a method selected from the group consisting of sputtering, plasma spray coating, thermal spray coating, electrospray deposition, chemical vapor deposition (e.g., plasma enhanced chemical vapor deposition, metal organic chemical vapor deposition), atomic layer deposition, physical vapor deposition, pulsed laser deposition, cathodic arc deposition, plating, electroless plating and electrohydrodynamic deposition. Preferably, in the method of the present invention, the electrically conductive layer is disposed on the base material by depositing the electrically conductive layer onto a surface of the base material (preferably, wherein the base material is a transparent material) using a method selected from the group consisting of chemical solution deposition, spray painting, dip coating, spin coating, knife coating, kiss coating, gravure coating, screen printing, ink jet printing and pad printing. Most preferably, in the method of the present invention, the electrically conductive layer is disposed on the base material by sputter depositing the electrically conductive layer onto a surface of the base material (preferably, wherein the base material is a transparent material).

Preferably, in the method of the present invention, the substrate provided comprises an electrically conductive layer disposed on the base material (preferably, wherein the base material is a transparent material), wherein the electrically conductive layer has an average thickness of 10 to 200 nm (more preferably, 50 to 150 nm; most preferably, 90 to 110 nm).

Preferably, the method of the present invention, further comprises: providing an adhesion promoting substance, and applying the adhesion promoting substance to the electrically conductive layer before depositing the plurality of masking fibers onto the electrically conductive layer; wherein the adhesion promoting substance promotes the adhesion of the plurality of masking fibers to the electrically conductive layer.

The spinning material used in the method of the present invention preferably comprises a masking material. More preferably, the spinning material comprises a masking material and a carrier. One of ordinary skill in the art will know to select appropriate materials for use as the masking material and the carrier. Preferred masking materials are photosensitive materials (e.g., positive or negative tone photoresist materials) that are suitable for deposition by a process selected from the group consisting of electrospinning, gas jet electrospinning, needleless electrospinning and melt electrospinning; and that are suitable as an etch resist when exposing the electrically conductive layer (preferably an electrically conductive metal layer) to the electrically conductive layer etchant (preferably a metal etchant). Preferably, the masking material is selected from (a) a mixture of diazonaphthoquinone and novolac resin; and, (b) a copolymer of an alkyl (alkyl)acrylate and an alkyl acrylic acid. More preferably, the masking material is a copolymer of an alkyl (alkyl)acrylate and an alkyl acrylic acid. Still more preferably, the masking material is a copolymer of a $C_{1-5}$ alkyl ($C_{1-4}$ alkyl)acrylate and a $C_{1-5}$ alkyl acrylic acid. Most preferably, the masking material is a copolymer of a methyl methacrylate and a methyl acrylic acid. Preferably, the masking material is a copolymer of alkyl (alkyl)acrylate and an alkyl acrylic acid, wherein the copolymer contains 5 to 15 mol % (more preferably, 5 to 10 mol %; most preferably, 6 to 9 mol %) of the alkyl acrylic acid. More preferably, the masking material is a copolymer of a $C_{1-5}$ alkyl ($C_{1-4}$ alkyl)acrylate and a $C_{1-5}$ alkyl acrylic acid, wherein the copolymer contains 5 to 10 mol % (more preferably, 5 to 10 mol %; most preferably, 6 to 9 mol %) of the $C_{1-5}$ alkyl acrylic acid. Most preferably, the masking material is a copolymer of a methyl methacrylate and a methyl acrylic acid, wherein the copolymer contains 5 to 10 mol % (more preferably, 5 to 10 mol %; most preferably, 6 to 9 mol %) of the methyl acrylic acid. Preferably, the copolymer has a number average molecular weight, $M_N$, of 10,000 to 1,000,000 g/mol (preferably, 50,000 to 500,000 g/mol; more preferably, 75,000 to 300,000 g/mol; most preferably, 150,000 to 250,000 g/mol). Preferably, the carrier is selected from at least one of chloroform, ethyl lactate, methyl ethyl ketone, acetone, propanol, methanol, isopropanol, tetrahydrofuran (THF), dimethyl sulfoxide (DMSO) and acrylonitrile (AN) (preferably, the carrier is ethyl lactate). Preferably, the spinning material contains 5 to 25 wt % (more preferably, 7.5 to 20 wt %; most preferably, 8 to 15 wt %) of the masking material in the carrier.

Preferably, in the method of the present invention, the spinning material is formed into fibers and deposited onto the electrically conductive layer by a process selected from the group consisting of electrospinning, gas jet electrospinning, needleless electrospinning and melt electrospinning More preferably, in the method of the present invention, the spinning material is formed into fibers and deposited onto the electrically conductive layer by electrospinning Still more preferably, in the method of the present invention, the spinning material is formed into fibers and deposited onto the electrically conductive layer by electrospinning, wherein the spinning material is fed through a nozzle having a central opening, forming a plurality of masking fibers and depositing the plurality of masking fibers onto the electrically conductive layer on the transparent substrate. One of ordinary skill in the art will know to select appropriate electrospinning process conditions. Preferably, in the method of the present invention, the spinning material is fed through the nozzle at a flow rate of 0.1 to 100 μL/min (more preferably, 1 to 50 μL/min; still more preferably, 10 to 40 μL/min; most preferably 20 to 30 μL/min).

Preferably, in the method of the present invention, the nozzle is set at an applied positive difference of electric potential relative to the substrate. More preferably, the applied electric potential difference is 5 to 50 kV (preferably, 5 to 30 kV; more preferably, 5 to 25 kV; most preferably, 5 to 10 kV).

Preferably, the method of the present invention, further comprises: compressing the plurality of deposited fibers on the electrically conductive layer to ensure good contact between the plurality of deposited fibers and the electrically conductive layer. Preferably, the plurality of deposited fibers on the electrically conductive layer are compressed by placing the substrate with the electrically conductive layer and the plurality of deposited fibers thereon between two non-stick sheets (e.g., two teflon sheets) before compressing the plurality of deposited fibers.

Preferably, the method of the present invention, further comprises: baking the plurality of deposited fibers to ensure good wetting of the plurality of deposited fibers onto the electrically conductive layer. Preferably, the plurality of deposited fibers Preferably, the plurality of deposited fibers are baked at a temperature of $T_g$ to $T_g+20°$ C., wherein $T_g$ is the glass transition temperature of the plurality of deposited fibers. More preferably, the plurality of deposited fibers are baked by placing the substrate in an oven set at 75 to 120° C. (preferably, 80 to 110° C.; more preferably, 90 to 105° C.) for 10 minutes to 2 hours (preferably, 20 minutes to 1 hour; more preferably, 30 to 45 minutes).

Preferably, in the method of the present invention, the plurality of deposited fibers are patterned to modify a property of a select portion of the plurality of deposited fibers to provide a treated fiber portion and an untreated fiber portion. Preferably, the plurality of deposited fibers are photosensitive materials. More preferably, the plurality of deposited fibers are photoimageable. Preferably, the plurality of deposited fibers are patterned by treating a select portion of the plurality of deposited fibers to a form of radiation (e.g., actinic radiation, ultraviolet light, electrons, x-rays) to provide the treated fiber portion. More preferably, the plurality of deposited fibers are patterned by treating a select portion of the plurality of deposited fibers to actinic radiation of the appropriate wavelength. Preferably, in the method of the present invention, the patterning of the plurality of deposited fibers results in a modification of a solubility in the developer of the treated fiber portion relative to the untreated fiber portion. Preferably, the plurality of deposited fibers can have a negative resist behavior, wherein the treated fiber portion upon exposure to radiation during patterning is rendered insoluble in the developer, while the untreated fiber portion remains soluble in the developer. Preferably, the plurality of deposited fibers can have a positive resist behavior, wherein the treated fiber portion upon exposure to radiation during patterning is rendered soluble in the developer relative to the untreated fiber portion, while the untreated fiber portion remains insoluble in the developer.

Preferably, in the method of the present invention, the developer is selected based on the relative solubilities of the treated fiber portion and the untreated fiber portion. Preferably, the developer is selected from the group consisting of sodium hydroxide, potassium hydroxide, tetramethyl ammonium hydroxide, isopropyl alcohol, acetone and mixtures thereof. More preferably, the developer is a mixture of isopropyl alcohol and acetone. Most preferably, the developer is a mixture of 80 to 95 wt % (more preferably, 85 to 95 wt %; most preferably, 88 to 92 wt %) isopropyl alcohol and 20 to 5 wt % (more preferably, 15 to 5 wt %; most preferably, 12 to 8 wt %) acetone.

Preferably, in the method of the present invention, the plurality of deposited fibers is developed after patterning by contacting the plurality of deposited fibers with the developer, wherein either (i) the treated fiber portion, or (ii) the untreated fiber portion is removed; leaving a patterned fiber array. Preferably, the plurality of deposited fibers is developed after patterning to remove the treated fiber portion by exposing the plurality of deposited fibers to a developer; leaving a patterned fiber array. Preferably, the plurality of deposited fibers is developed after patterning to remove the untreated fiber portion by exposure to a developer; leaving a patterned fiber array. Preferably, the plurality of deposited fibers is developed after patterning by immersion in a developer to leave a patterned fiber array. More preferably, the plurality of deposited fibers is developed after patterning by immersion in a stirred developer bath to leave a patterned fiber array.

Preferably, in the method of the present invention, the electrically conductive layer, with the patterned fiber array deposited thereon, is contacted with an electrically conductive layer etchant, wherein the electrically conductive layer that is not covered by the patterned fiber array is removed (preferably, etched away) from the substrate leaving at least one interconnected conductive network on the substrate that is covered by the patterned fiber array. One of ordinary skill in the art will know to select an appropriate electrically conductive layer etchant for the electrically conductive layer used in the method of the present invention. Preferably, when the electrically conductive layer is silver, the electrically conductive layer etchant is selected from the group consisting of an ammonium hydroxide/hydrogen peroxide solution in methanol (preferably a 1:1:4 molar mixture of $NH_4OH:H_2O_2:CH_3OH$); an aqueous iron (III) nitrate nonahydrate solution (preferably an aqueous solution of 1 wt % $Fe(NO_3)_3$, 0.2 wt % thiourea and optional 10 wt % ethanol); and, an aqueous phosphoric acid/nitric acid/acetic acid solution (preferably a 3:3:23:1 molar mixture of $H_3PO_4:HNO_3:CH_3COOH:H_2O$). When the electrically conductive layer is silver, the electrically conductive layer etchant is more preferably selected from the group consisting of an aqueous iron (III) nitrate nonahydrate solution (preferably an aqueous solution of 1 wt % $Fe(NO_3)_3$, 0.2 wt % thiourea and optional 10 wt % ethanol); and, an aqueous phosphoric acid/nitric acid/acetic acid solution (preferably a 3:3:23:1 molar mixture of $H_3PO_4:HNO_3:CH_3COOH:H_2O$). When the electrically conductive layer is silver, the electrically conductive layer etchant is most preferably an aqueous iron (III) nitrate nonahydrate solution (preferably an aqueous solution of 1 wt % $Fe(NO_3)_3$, 0.2 wt % thiourea and optional 10 wt % ethanol).

Preferably, the method of the present invention, further comprises: providing a stripping composition; applying the stripping composition to the patterned fiber array to remove the patterned fiber array and to uncover the conductive network on the substrate. Preferably, the stripping composition provided is a good solvent for the patterned fiber array. Preferably, the stripping composition provided is selected from polyhydric alcohol, chloroform, methyl ethyl ketone, acetone, propanol, methanol, isopropanol and mixtures thereof (more preferably, a mixture of acetone and isopropanol; most preferably, acetone).

Preferably, in the method of the present invention, the stripping composition provided optionally further includes one or more other components, such as wetting agents or surfactants, anti-freeze agents and viscosity modifiers. Preferred surfactants include nonionic and anionic surfactants. More preferred surfactants include nonionic surfactants. Preferably, the stripping composition provided contains 0 to 5 wt % (more preferably, 0.2 to 5 wt %; most preferably, 0.5 to 3.5 wt %) surfactant, based on the total weight of the composition.

Preferably, in the method of the present invention, the interconnected conductive network is formed in a controlled pattern on the substrate. Preferably, the controlled pattern is at least one interconnected conductive network. More preferably, the controlled pattern is a plurality of isolated interconnected conductive networks, wherein each interconnected conductive network in the plurality of isolated interconnected conductive networks is electrically isolated from the other interconnected conductive networks in the plurality of isolated interconnected conductive networks. Still more preferably, the controlled pattern is an interconnected conductive network multisected by non-conductive regions. Most preferably, the controlled pattern is a plurality of isolated, interconnected grids of electrically conductive traces, wherein each of the isolated, interconnected grids of electrically conductive traces is isolated from the other isolated, interconnected grids of electrically conductive traces by one or more non-conductive regions on the substrate. Preferably, each interconnected grid has a grid pattern. Grid patterns include, for example, straight sided polygons (such as, diamonds, squares, rectangles, triangles, hexagons, etc.); circles; multi-curved shapes; combination curved and straight sided shapes (e.g., semi-circles); and, combinations thereof.

Preferably, in the method of the present invention, the plurality of masking fibers are formed having narrow diameters. The narrow fiber diameters are believed to facilitate the formation of an interconnected conductive network having narrow line widths such that the obstruction of light passing through the patterned transparent conductor is minimized in order to maximize transparency, to minimize haze and to minimize visibility of the interconnected conductive network to the human eye. Preferably, the masking fibers in the plurality of masking fibers are formed and deposited on the electrically conductive layer, wherein the deposited masking fibers have an average diameter of ≤200 µm. More preferably, the masking fibers in the plurality of masking fibers are formed and deposited on the electrically conductive layer, wherein the deposited masking fibers have an average diameter of ≤100 µm. Still more preferably, the masking fibers in the plurality of masking fibers are formed and deposited on the electrically conductive layer, wherein the deposited masking fibers have an average diameter of ≤20 µm. Most preferably, the masking fibers in the plurality of masking fibers are formed and deposited on the electrically conductive layer, wherein the deposited masking fibers have an average diameter of ≤2 µm.

The patterned conductor made using the method of the present invention preferably exhibits a sheet resistance, $R_s$, (as measured using the method described herein in the Examples) of ≤100 Ω/sq (more preferably, ≤50 Ω/sq; still more preferably, ≤10 Ω/sq; most preferably ≤5 Ω/sq).

The patterned conductor made using the method of the present invention preferably exhibits a total transmittance of ≥80% (more preferably ≥90%; most preferably ≥95%).

The patterned conductor made using the method of the present invention preferably exhibits a haze of ≤5% (more preferably ≤4%; most preferably ≤3%).

Some embodiments of the present invention will now be described in detail in the following Example.

The total transmittance, $T_{Trans}$, data reported in the Example was measured according to ASTM D1003-11e1 using a BYK Instrument's Haze-gard plus transparency meter.

The haze, $H_{Haze}$, data reported in the Example was measured according to ASTM D1003-11e1 using a BYK Instrument's Haze-gard plus transparency meter.

The sheet resistance of the patterned conductor was measured according to ASTM F1844 using a Delcom 717B non-contact conductance monitor and according to ASTM F390-11 using a Jandel HM-20 collinear 4 point probe test unit from Jandel Engineering Limited.

The substrate used in the Examples was a silver coated polyethylene terephthalate film having an average silver layer thickness of 150 nm (available from Materion Corporation).

The spinning material comprising a masking material and a carrier used in the Examples. The masking material used was a copolymer of methyl methacrylate and 8.2 to 8.5 mol % methyl acrylic acid having a number average molecular weight, $M_N$, of 200,000 g/mol. The masking material was then dissolved with ethyl lactate to provide a 10 wt % solution. Then 83 wt % of the ethyl lactate was removed from the 10 wt % solution through evaporation under nitrogen purge and then 30 wt % acetone was added to provide the spinning material.

EXAMPLES: PREPARATION PATTERNED TRANSPARENT CONDUCTOR

A plurality of masking fibers were electrospun onto the substrate to form a plurality of deposited fibers using a bench-top electrospinning cabin from IME Technologies equipped with a single nozzle spinning head and a rotating drum substrate carrier (module EM-RDC having a drum with a 100 mm diameter and 220 mm length). The nozzle used had an inner diameter of 0.5 mm. When electrospinning, the spinning material was fed to the nozzle using a ProSense Model No. NE1000 syringe pump set to deliver the spinning material at the flow rate listed in TABLE 1. The substrate was wrapped around the rotary drum of a Module EM-RDC rotating drum collector from IME Technologies with the metalized surface facing out. The remaining parameters for the spinning operation in the Examples were as follows: the distance between the rotating substrate and the needle was set at 8.5 cm; the drum beneath the substrate was set at −4 kV; the drum rotation rate on the rotating drum collector (y axis) was set at rpm noted in TABLE 1; the nozzle was set at the voltage noted in TABLE 1; the needle scan speed (x axis) was set as noted in TABLE 1; and, the needle scan distance was set at 120 mm. The spinning operation was allowed to proceed for 1 minute. The substrate was then rotated 90 degrees on the rotating drum (such that the orientation of the rotation of the substrate on the rotation drum is perpendicular to the first spinning pass), and the spinning operation was reinitiated and allowed to proceed for another 1 minute.

TABLE 1

| Ex. | Flow rate (μL/min) | Drum speed (rpm) | Nozzle voltage (kV) | Scan speed (mm/sec) |
|---|---|---|---|---|
| 1 | 14.5 | 1,000 | 3 | 4 |
| 2 | 8 | 500 | 4 | 2 |

In each Example, the substrate with the plurality of deposited fibers was then placed in an oven set and backed under the conditions set forth in TABLE 2.

TABLE 2

| Ex. | Sample | Treatment conditions |
|---|---|---|
| TC1 | A | baked 30 minutes in oven set at 80° C. |
| TC2 | A | — |
| TC3 | A | Baked 30 minutes in oven set at 80° C. |
| T1 | Ex. 1 | Baked 30 minutes in oven set at 80° C. |
| T2 | Ex. 1 | Baked 30 minutes in oven set at 100° C. |
| T3 | Ex. 2 | Baked 30 minutes in oven set at 100° C. |
| T4 | Ex. 2 | Baked 45 minutes in over set at 100° C. |

A - clean substrate w/o deposited fibers

A substrate prepared according to Example Ti, with the plurality of deposited fibers was then patterned by covering a portion of the plurality of deposited fibers with a polyethylene plaque and exposing the uncovered portion of the plurality of deposited fibers to UV light using a pulsed Xenon RC 800 having a Xenon UVB lamp set with a cut-off of 200 nm and an intensity of 1 J/cm$^2$ under ambient conditions. The uncovered portion of the plurality of deposited fibers were subjected to 100 seconds of total exposure time over 4 cycles of 25 seconds each to provide a treated fiber portion. The treated fiber portion was then developed by placing the substrate in a developer bath with gentle agitation for 30 seconds, wherein the developer in the bath was a 90/10 wt % solution of isopropyl alcohol and acetone. Following development, the treated fiber portion was observed to have been removed from the surface of the substrate, while the untreated fiber portion was observed to remain intact.

In each of the Examples, the substrate with the plurality of deposited fibers remaining thereon was then immersed in a bath of an aqueous solution of 1 wt % iron (III) nitrate nonahydrate, 0.2 wt % thiourea and 10 wt % ethanol for the etch time noted in TABLE 3. The substrate was then given a 5 sec. dip in three successive deionized water baths at atmospheric temperature. The substrate was then allowed to air dry under ambient conditions leaving a patterned conductor with an interconnected silver network covered by the plurality of deposited fibers.

In each of the Examples, the plurality of deposited fibers were then removed by immersing the substrate in an acetone bath for five minutes without agitation. The substrate was then removed from the acetone bath and allowed to dry under air at ambient conditions leaving a substrate with an uncovered interconnected silver network thereon.

The total transmittance, $T_{Trans}$; the haze, $H_{Haze}$; and the sheet resistance of the substrate prepared according to each of Examples were then measured at multiple points on each sample. The average of those measurements is reported in TABLE 3.

TABLE 3

| Ex. | Etch time (min) | $T_{Trans}$ (%) | $H_{Haze}$ (%) | Sheet Resistance (Ω/sq) |
|---|---|---|---|---|
| TC1 | 3.33 | 89.98 | 2.1 | — |
| TC2 | 3.33 | 89.94 | 2.3 | — |
| TC3 | 3.33 | 90.01 | 0.7 | — |
| T1 | 3 | 87.4 | 2.2 | 17 to 50 |
| T2 | 5 | 88.4 | 1.1 | 38 |
| T3 | 30 | 85.4 | 1.3 | 8 |
| T4 | 41 | 87.6 | 1.3 | 15 |

We claim:

1. A method of manufacturing a patterned conductor, comprising:
   providing a substrate, wherein the substrate comprises:
      a base material; and,
      an electrically conductive layer, wherein the electrically conductive layer is disposed on the substrate;
   providing an electrically conductive layer etchant;
   providing a spinning material, wherein the spinning material comprises:
      a carrier; and,
      a masking material, wherein the masking material is a photosensitive material;
   providing a developer;
   forming a plurality of masking fibers by processing the spinning material by a process selected from the group consisting of electrospinning, gas jet electrospinning, needleless electrospinning, and melt electrospinning;
   depositing the plurality of masking fibers onto the electrically conductive layer, forming a plurality of deposited fibers;
   optionally, compressing the plurality of deposited fibers on the electrically conductive layer;
   patterning the plurality of deposited fibers to modify a property of a select portion of the plurality of deposited fibers to provide a treated fiber portion and an untreated fiber portion;
   developing the plurality of deposited fibers by contacting the plurality of deposited fibers with the developer, wherein either (i) the treated fiber portion, or (ii) the untreated fiber portion is removed; leaving a patterned fiber array;
   contacting the electrically conductive layer to the electrically conductive layer etchant, wherein the electrically conductive layer that is uncovered by the patterned fiber array is removed from the substrate, leaving a patterned conductive network on the substrate covered by the patterned fiber array to provide the patterned conductor;
   providing a stripper; and,
   treating the patterned fiber array with the stripper, wherein the patterned fiber array is removed to uncover the patterned conductive network on the substrate;
   wherein the patterned conductive network is a controlled pattern; wherein the controlled pattern is a plurality of isolated interconnected conductive networks; wherein each interconnected conductive network in the plurality of isolated interconnected conductive networks is electrically isolated from the other interconnected conductive networks in the plurality of isolated interconnected conductive networks.

2. The method of claim 1, wherein the patterned conductor is a patterned transparent conductor.

3. The method of claim 2, wherein the electrically conductive layer is an electrically conductive metal layer selected from the group consisting of silver, copper, palladium, platinum, gold, zinc, silicon, cadmium, tin, lithium, nickel, indium, chromium, antimony, gallium, boron molybdenum, germanium, zirconium, beryllium, aluminum, magnesium, manganese, cobalt, titanium, alloys and oxides thereof.

4. The method of claim 3, wherein the plurality of masking fibers are formed and deposited onto the electrically conductive layer using electrospinning.

5. The method of claim 4, wherein the masking material is a copolymer of an alkyl (alkyl)acrylate and an alkyl acrylic acid.

6. The method of claim 5, wherein the masking material is a copolymer of a $C_{1-5}$ alkyl ($C_{1-4}$ alkyl)acrylate and a $C_{1-5}$ alkyl acrylic acid, wherein the copolymer contains 5 to 10 mol % of the $C_{1-5}$ alkyl acrylic acid.

7. The method of claim 3, wherein the electrically conductive layer is silver.

8. The method of claim 7, wherein the patterned transparent conductor has a total transmittance of ≥80%; a haze of ≤5%; and, a sheet resistance of ≤5 Ω/sq.

9. A patterned transparent conductor made according to the method of claim 8.

\* \* \* \* \*